Aug. 30, 1966 A. R. DAVIS 3,270,250

LIQUID VAPOR COOLING OF ELECTRICAL COMPONENTS

Filed Feb. 6, 1963 4 Sheets-Sheet 1

INVENTOR.
ARIEL R. DAVIS

BY
Frank A. Bower
his ATTORNEY

LIQUID VAPOR COOLING OF ELECTRICAL COMPONENTS

INVENTOR.
ARIEL R. DAVIS
BY
Frank G. Bower
his ATTORNEY

INVENTOR.
ARIEL R. DAVIS
BY
Frank G. Bower
his ATTORNEY

LIQUID VAPOR COOLING OF ELECTRICAL COMPONENTS

Filed Feb. 6, 1963 4 Sheets-Sheet 4

INVENTOR.
ARIEL R. DAVIS
BY Frank A. Bower
his ATTORNEY

United States Patent Office 3,270,250
Patented August 30, 1966

3,270,250
LIQUID VAPOR COOLING OF ELECTRICAL COMPONENTS

Ariel R. Davis, 3687 South St., Salt Lake City 15, Utah
Filed Feb. 6, 1963, Ser. No. 256,752
1 Claim. (Cl. 317—100)

This invention relates to the dissipation of heat from electrical components passing heavy currents through small current carrying elements, such as in semiconductors, rectifiers, solid state controlled rectifiers, transistors, Zener diodes, power transformers, solid state symmetrical switches, printed circuits and the like.

In semiconductors the junction temperatures must be maintained below specified limits in order to maintain their operating characteristics and prevent destruction of the unit. If the junction temperatures are exceeded, permanent damage may occur to the junction of the semiconductor altering its characteristics or causing failure by melting of the junction connection or by thermal runaway of the semiconductor. Further, semiconductors are particularly sensitive to excessive temperatures. In order to maintain the temperature below the specified limits, the currents passed must not exceed given amounts for any substantial period of time. Heat conductors made of metal must be attached to the semiconductors to provide a path for conducting heat away and providing a large surface for its radiation and transference to the surrounding medium. These metal heat sinks have the disadvantage that the heat dissipation is slow and a temperature gradient is produced in the sink which causes the temperature at the semiconductor to be substantially higher than the outer part of the sink or the ambient conditions enveloping the unit. To increase this dissipation large, thick metal heat sinks are used which are substantially larger than the semiconductor. This excessive size detracts substantially from the advantage a semiconductor has in carrying high currents for its particular size. The large heat sink increases the volume occupied by the equipment for the amount of current passed while still permitting the semiconductor junction to be at high temperatures. These solid heat sinks dissipate the heat slowly through the sink causing an extreme temperature gradient between the junction and the outer portions of the heat sink.

An object of the invention is to provide heat dissipating means that effectively makes available a large heat dissipating surface at a semiconductor junction for the rapid transfer of heat from the junction to maintain the junction temperature below specified limits while carrying heavy currents.

Another object of the invention is to provide a compact heat dissipating means for rapidly removing heat from small electrical components passing high currents to maintain the temperature of the components below specified operating limits while maintaining the size of the dissipating means low in comparison to the current passed by the component cooled.

Another object of the invention is to provide rapid heat dissipating means for removing heat from closely mounted electrical components comprising semiconductors, printed circuits, coils, transformers, resistors and the like.

Other and further objects will be apparent from the following description taken in connection with the drawings, in which—

FIG. 8 is a perspective view of a wafer or junction of a semiconductor immersed in the cooling medium;

Figure 9:
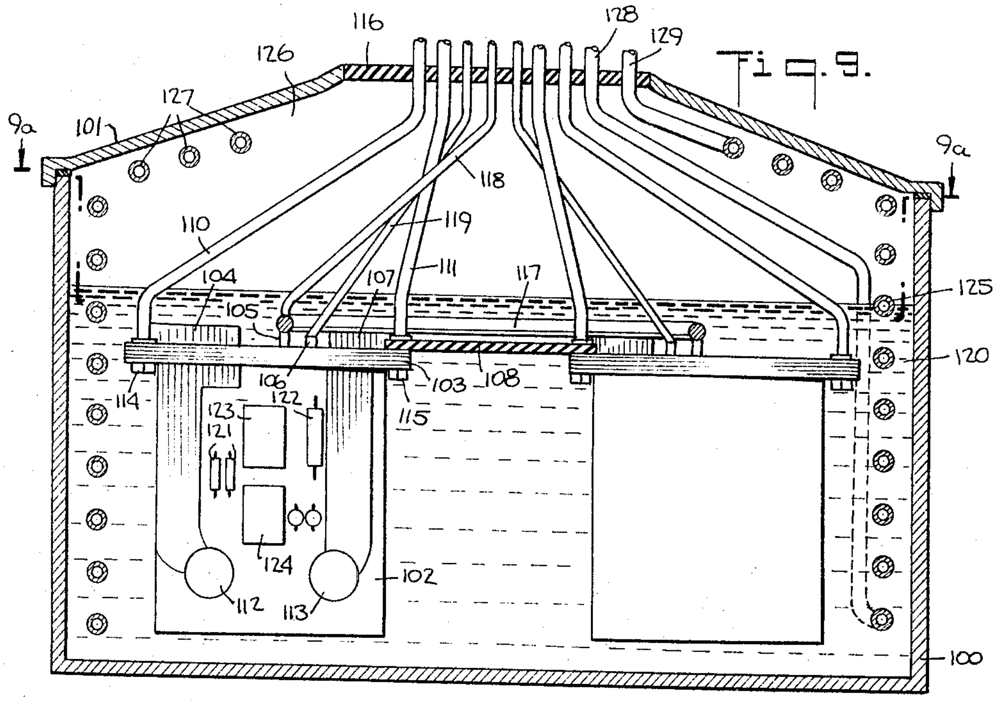
Figure 9A:
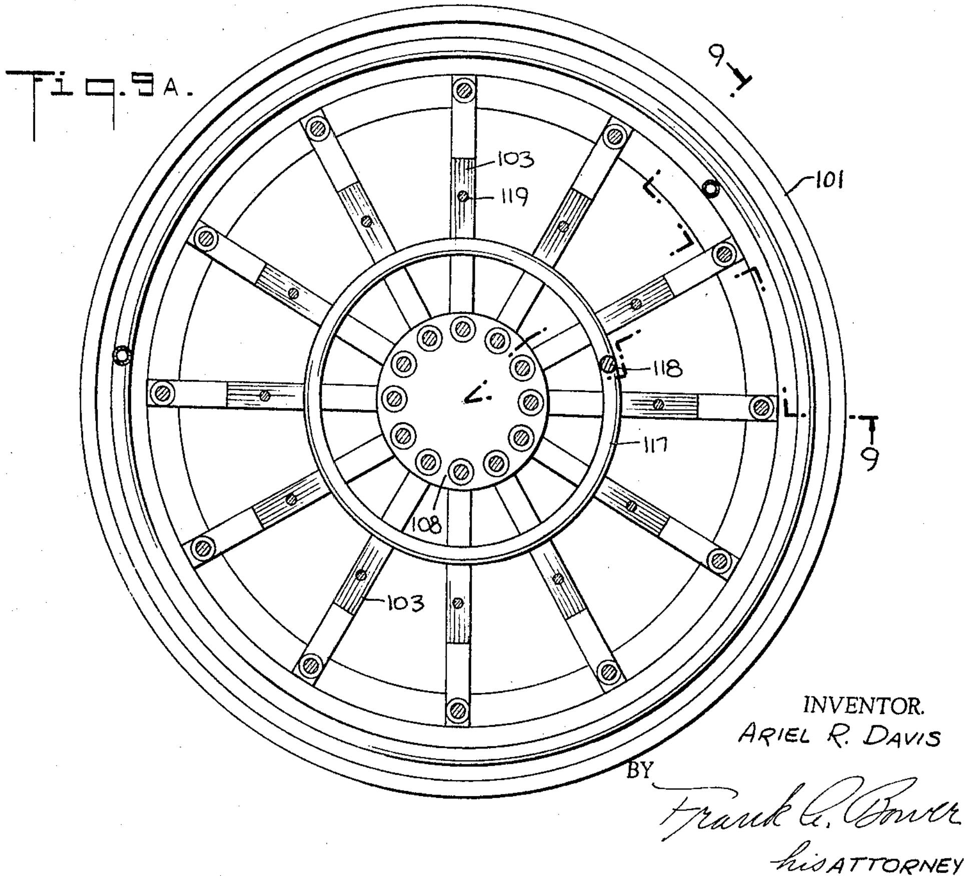
Figure 9:
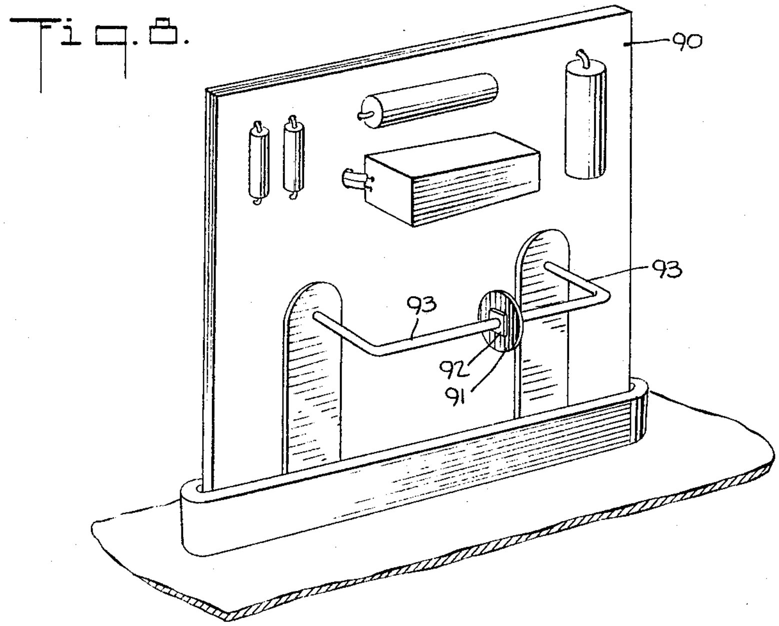
Figure 10:
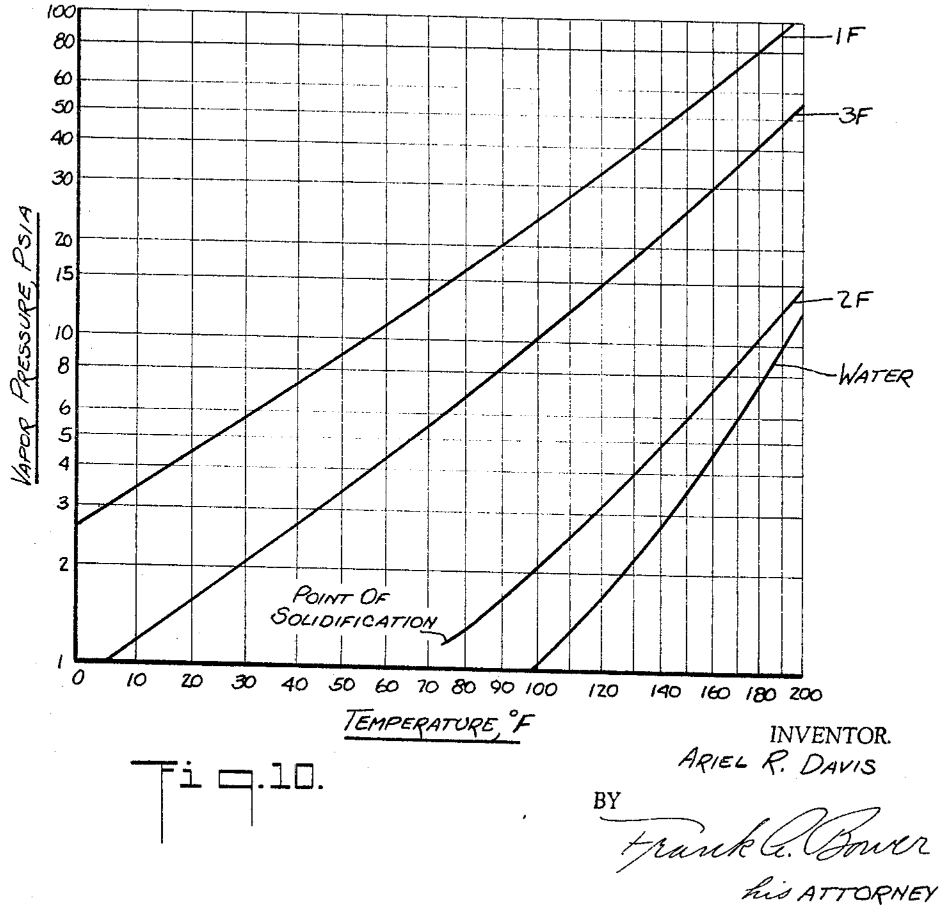

FIGS. 9 and 9*a* are sectional views of an embodiment of a plurality of circuits mounted in a single heat dissipating means; and FIG. 10 is a chart illustrating the temperature and absolute pressure relationship of cooling liquids used in the heat dissipating means.

Figures 1, 2, 3:
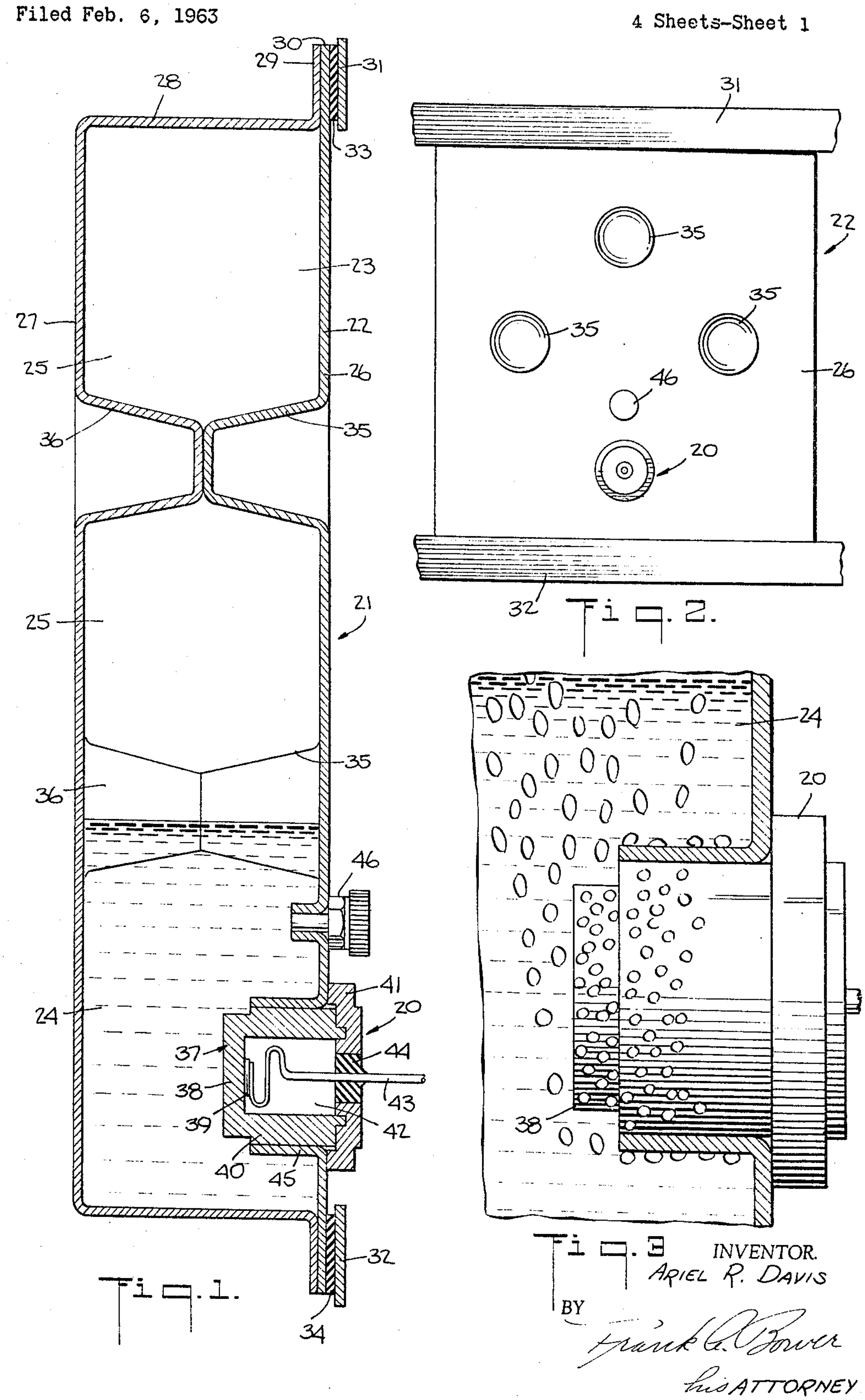
FIG. 1 illustrates a sectional side view of a heat dissipating means with a semiconductor rectifier.
FIG. 2 is a front view of the embodiment of FIG. 1.
FIG. 3 is a diagrammatic illustration of an enlarged view of the dissipating of heat from the semiconductor rectifier of FIG. 1.

Referring to FIGS. 1 to 3 of the drawings, a semiconductor rectifier 20 is mounted in a heat dissipating means 21 comprising a metal container 22 forming a liquid and vapor tight chamber 23. The semiconductor 20 is mounted in the lower portion of the container 22 and a cooling medium 24 partly fills the chamber 23 to completely immerse the semiconductor 20. The remaining space 25 above the cooling medium is evacuated of air. Thus the chamber contains liquid in the lower portion and vapors of the liquid in the space above the liquid. The vapor pressure above the liquid depends on the type of liquid used and the temperature of the liquid. The cooling liquid should have good wetting qualities and be inert. Inert means that the cooling medium is an electrical non-conductor, non-poisonous, non-corrosive, non-flammable, non-explosive and non-toxic. The vapor pressure of the liquid must be low in relation to the temperature limits specified for the operation of the semiconductor.

The container 22 is preferably made of thin metal, such as aluminum or copper with a dull black surface which has good heat transferring properties. The container is exposed to the surrounding ambient temperature for radiation of heat and contact by air currents against its external surfaces. As illustrated in FIG. 1 the container may have a front wall 26 and a back wall 27 with side walls 28 stamped as a single piece with the back walls 27. Flanges 29 and 30 are provided at the edges and joined by welding or other method to form a liquidtight, vaportight seal. The flanges may be used to secure the heat dissipating means 21 in any suitable manner, such as by straps 31, 32 electrically insulated from the container 22 by the insulating spaces 33, 34. Dimples 35 are provided in the wall 26 and dimples 36 are provided in the wall 27 to reinforce the walls and prevent their collapse on the evacuation of the space 25.

The semiconductor 20 is of a standard type and has a cup-shaped base 37 with a bottom wall 38 supporting the wafer or junction 39. A cylindrical wall 40 extends to the base for mounting on a disc support 41 to hermetically seal chamber 42 containing the junction 39. A lead 43 extends through the insulator 44 in the disc member 41 for connection with the wafer 39 in a conventional manner. In this embodiment the container 22 is electrically connected to the semiconductor 20 by the cylindrical wall 40 tightly fitting in the cylindrical flange 45 to form a liquid and vapor tight seal therebetween. Terminal 46 may be mounted in the wall 26 for the connection of a lead. It is, of course, understood that if desired the semiconductor 20 could be electrically isolated from the container 22 and a separate lead connected between the bottom wall 38 and an electrically isolated terminal mounted in the container.

The flange 45 extends into the cooling medium 24 and the wall 38 of the semiconductor is positioned towards the middle of the container at the lower end thereof and within the cooling medium. The space 25 is evacuated of air so that the vapor pressure therein is dependent upon the temperature of the cooling medium. In this embodiment it is preferred to use tetrachlorodifluoroethane, $CCl_2F—CCl_2F$. The relation of the vapor pressure to temperature is illustrated by the curve marked 2F in FIG. 10, and this material will be referred to as 2F hereinafter. As illustrated in the chart, 2F solidifies at 74.8° F. so at normal room temperatures the cooling medium is solid. In this embodiment the semiconductor junction operating temperature will depend on the room ambient temperature, the size, shape and color and finish of the radiation surface of the container 22 and the air flow around the container.

Matter exists either as a solid, liquid or gas under proper conditions of temperature and pressure. Transition from one state to another is accompanied by the absorption or liberation of heat without a change of temperature but with a change of volume. Therefore, by utilizing this phenomenon a point source of heat, such as generated by a semiconductor junction, can be immediately spread over a large radiating surface keeping the junction temperature within a few degrees of surface temperature of the heat sink.

The heat is generated in the wafer 39 contacting the wall 38 and is conducted through the wall 38 and the cylindrical wall 40. The liquid rapidly vaporizes to form small vapor bubbles. The vapor bubbles promptly detach from the walls 38 and from the flange 45 to rapidly rise in the liquid 24. On reaching the surface of the liquid the vapors disperse through the space 25 for condensation on the cooler inner surface of the walls 26, 27 and 28. The condensate then drains back into the coolant. The rapid vaporization and the immediate detachment of the vapor bubbles from the base of the semiconductor 20 rapidly draws the heat from the wafer 39 so that excessive temperatures are not reached. Thus the walls 26, 27 and 28 are in effect positioned adjacent to the semiconductor to make available a large surface for the transfer of heat.

This rapid transfer of heat from the wafer or junction 39 to the walls of the container permits the semiconductor to carry currents several times greater than that which would be permitted if the semiconductor was mounted on solid metal heat sinks which would be of a comparable size to that of the heat dissipating means 21. Thus the increase in current increases the ratio of the current passed by the semiconductor to the total size of the semiconductor with the heat dissipating means.

As seen from the foregoing description the liquid coolant rapidly forms small bubbles on the semiconductor to extract the heat from the semiconductor and maintain the temperature of the junction so that it may pass heavy currents. The liquid coolant has good wetting qualities and as soon as the bubbles form they are released from the semiconductor and rise rapidly in the coolant to disperse in the space for condensation on the walls of the container. The walls of the container are a few degrees below the temperature of the semiconductor and the walls of the container are available to the semiconductor for rapid heat transfer at approximately the same temperature. Thus the metal container with the liquid coolant is an excellent absorber of heat from the semiconductor.

Figures 4, 5:
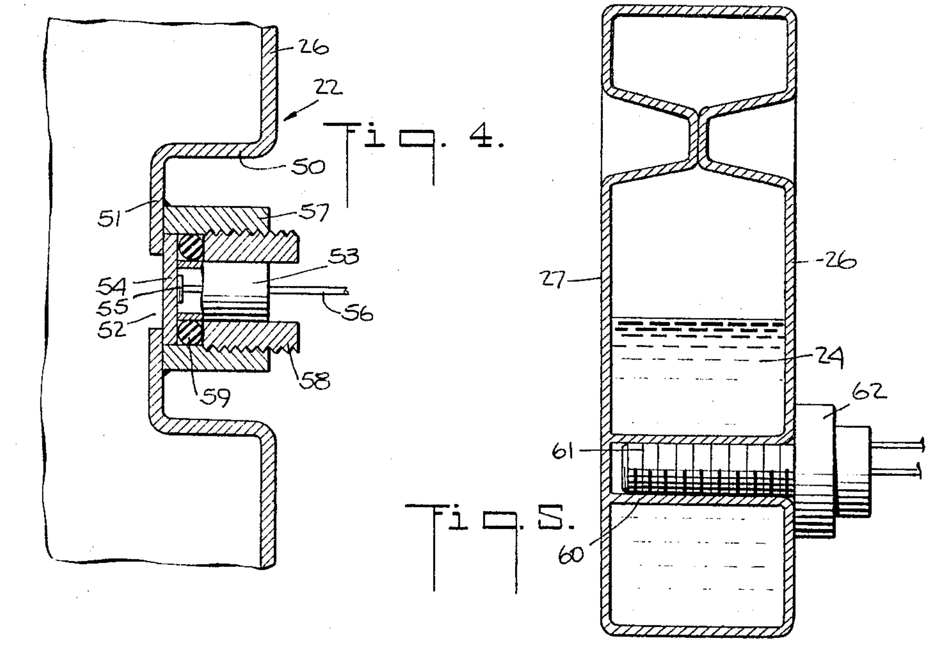
FIG. 4 illustrates the heat dissipating means of FIG. 1 with a fitting for detachably mounting a semiconductor.
FIG. 5 is a fragmentary sectional side view of the heat dissipating means of FIG. 1 with a threaded fitting having a threaded controlled rectifier therein.

In FIG. 4 a modification of the container or casing 22 is illustrated in which the wall 26 is formed with a cylindrical flange 50. The flange 50 has a disc 51 with an opening 52. The semiconductor 53 has a base 54 centered over the opening 52 and engaging the disc 51. The wafer or junction 55 is mounted on the base with lead 56 attached thereto in a conventional manner. A threaded fitting 57 is attached to the base concentric to the opening 52. The semiconductor is positioned within the fitting and a sleeve type nut 58 is threaded therein to hold the semiconductor in place. An O-ring 59 seals the fittings. The semiconductor can easily be replaced by removing the nut 58. In order to evacuate the chamber the air is readily cleared by vaporizing the coolant and driving the air through the opening 52. The semiconductor is then sealed in position by the nut and O-ring.

In FIG. 5 another form of mounting a semiconductor, such as a silicon controlled rectifier, is illustrated. A threaded support 60 extends between the walls 26 and 27 and is secured thereto. The stem 61 of the semiconductor threads into the support with the base 62 bearing against the wall 26. Thus, as in the embodiment of FIG. 4, the semiconductor is replaceable. The coolant 24 immerses the support 60 and the heat from the base 62 is transferred through the wall 26 and through the stem 61 to the support 60 for dispersion by the coolant as previously described.

Figure 6:
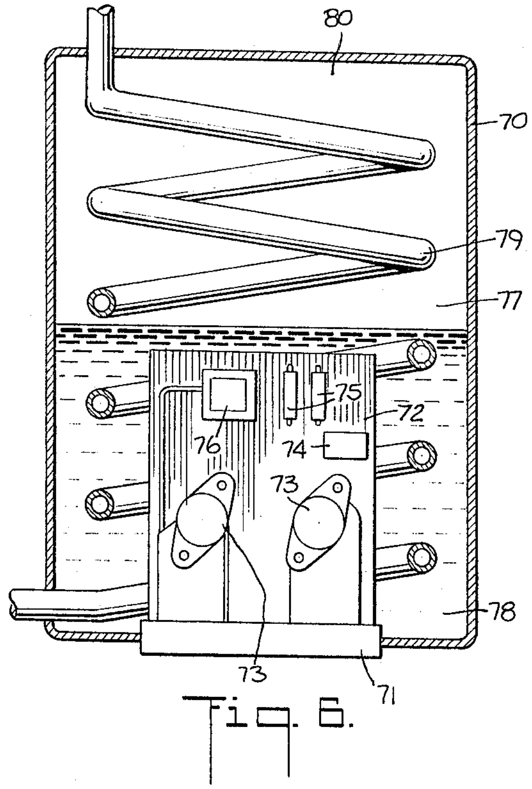
FIG. 6 is a sectional view of a water-cooled heat dissipating means with a printed circuit having semiconductors.
Figure 7:
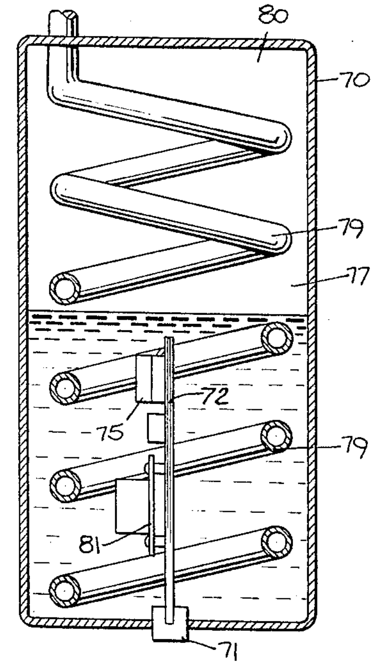
FIG. 7 is a sectional side view of the embodiment of FIG. 6.

In FIGS. 6 and 7 an embodiment of the invention is illustrated in which the container 70 has an electrical socket 71 mounted in the bottom and extending therethrough for passing current and voltage. A printed circuit 72 is fitted in the socket and supported thereby. The printed circuit has silicon controlled rectifiers 73, condensers 74, resistors 75, transformers 76 and the like. As in the previous embodiments the container 70 forms a liquid and vapor tight chamber 77 for holding the liquid coolant 78 and vapors produced in the cooling action. The liquid coolant immerses the printed circuit completely, as illustrated. In the previous embodiments the heat of the vapors was transmitted through the metal container to the air. In this embodiment a cooling coil 79 is positioned in the chamber 77 to extend from the top of the container through the vapor space 80 into the liquid coolant 78. Water or other fluid may be circulated through the coil during the operation of the rectifiers to condense the vapors of the liquid created by the heat generated in the rectifiers and in the other components, such as the resistors. In this instance the liquid coolant is trichlorotrifluoroethane, $CCl_2F—CClF_2$, hereinafter referred to as 3F. The relation of the absolute pressure and temperature of this coolant is shown in FIG. 10 by the line marked 3F. As in the previous embodiments it is preferable that the space above the coolant is evacuated so that the pressure therein is dependent on the vapor pressure of the liquid coolant. The cooling action is vigorous and active, with the bubbles forming and rising to the surface of the liquid for dispersal in the space above. This vigorous and active heat transference maintains the temperature of the metal base 81 of the rectifiers only a few degrees above the container and cooling coil. Thus these heat extracting elements of the heat dissipating means are effectively applied directly to the rectifier or semiconductors. The coolant 3F has a temperature of about 90° F. which produces a vapor pressure of about 8 p.s.i.a. Silicon controlled rectifiers normally rated at 20 amperes have been operated at 50 amperes for sustained periods of time with the temperature of the rectifier between 70 and 90° F., dependent on the rate of cooling by the walls of the container and the coil. The cooling rate of the coil is dependent on the temperature and the flow rate of the cooling water. Cooling also occurs on any of the parts generating heat, such as the resistors and the leads carrying heavy currents.

In FIG. 8 another printed circuit 90 is illustrated in which instead of having encapsulated semiconductors the base 91 and crystal wafer 92 are mounted directly on the printed circuit 90 by the leads 93. The wafer and base are coated with an oxide to protect the wafer against contamination. The liquid coolant is thus applied directly to the base and wafer for a direct transference of heat from the wafer. This increases the rate of transfer of heat from the wafer and thereby lowers its thermal impedance so that it further increases the capacity to pass heavy currents.

FIGS. 9 and 9*a* show an embodiment of the invention which illustrates an advantage of the invention by permitting the compact and close mounting of a plurality of heavy current carrying printed circuits within a small volume. In this embodiment twelve printed circuits are mounted within a single container, each with two 20-ampere silicon controlled rectifiers capable of carrying 60 amperes when cooled in accordance with this invention. Thus the embodiment controls a total wattage of 86,000 watts.

A metal container 100 has a lid 101 mounted thereon in a vaportight relationship. The printed circuits 102 are mounted in terminal blocks 103 with terminals 104, 105, 106 and 107 thereon. The terminal blocks extend radially in a spoked fashion and are secured in this arrangement by a center disc 108 and an outer ring 109 of electrical insulating material. This assembly is supported by the heavy leads 110, 111 carrying the heavy currents that pass through the rectifiers 112, 113 on the printed circuits. The lead 110 extends through the outer spacing ring 109 and through the outer end of the terminal block 103. The lead is secured thereto by a nut 114. The lead 111 extends through the disc 108 and the inner end of the terminal block 103. The lead 111 is secured by the nut 115. Leads 110 and 111 extend through insulating disc 116 in the cover 101. Individual leads 110 and 111 are provided for each printed circuit 102.

FIG. 9 is a sectional view taken along the angular section line 9—9 of FIG. 9*a* so that only one of the terminal blocks 103 and the associated elements is illustrated. The control signals are fed through the terminals 105 and 106 of each printed circuit. The terminals 105 are connected by a common conductive ring 117 and a single lead 118 which passes through the insulating disc 116. The other terminals 106 are individually connected by leads 119 which pass through the insulating disc 116. The leads 110, 111, 118 and 119 may be secured to various other connective means or to electrical components in a manner not related to this embodiment and, therefore, not illustrated. The metal container 100 is partly filled with 3F liquid coolant 120 to immerse the printed circuits and the electrical components thereon. The remaining space is preferably evacuated of air. In addition to the rectifiers 112 and 113, the printed circuits have resistors 121, condenser 122, transformers 123, 124 and other electrical components. When any of these additional components pass heavy currents, such as the resistors 121, the cooling action previously described in connection with the semiconductors will also occur in connection with these resistors. In view of the large wattage controlled within the container 100, a cooling coil 125 extends in the liquid coolant 120 and into the vapor space 126 provided above the coolant. For additional cooling effect the turns 127 of the coil may have a lesser radius to extend into the vapor chamber 126 to provide additional condensation for the vapors. The inlet and outlet conduits 128 and 129 extend through the insulating disc 116. On passage of current through the printed circuits the cooling action will occur in a similar manner as described in connection with the previous embodiments.

In the foregoing embodiments the liquids 2F and 3F are preferred, depending on whether the heat dissipating means is air cooled or liquid cooled. However, other coolants may be used, for example, trichloromonofluoromethane, $CCl_3F$, the characteristics of which are illustrated by line 1F of the chart of FIG. 10. Under certain conditions distilled water could be used as the cooling medium of an air cooled heat sink. Such conditions are where the water is in an electrical non-conductive relation to immersed elements, will not cause corrosion or have electrical components immersed in the water. The characteristics of water are partly illustrated in the chart of FIG. 10.

It is thus seen from the foregoing description that by immersing the semiconductors and other electrical components within a cooling medium and providing a condensing surface for the vapors created by the heat in these elements, the heat can be transferred rapidly without delay or temperature gradient to these condensing surfaces in such a manner that the condensing surfaces are effectively at the semiconductors. This means that a tremendous cooling surface can be made available to the heated semiconductors to rapidly withdraw the heat so that the semiconductors may carry currents greatly in excess of that which they could normally carry when using solid metal heat sinks.

The foregoing embodiments are only illustrative of the invention. The invention may, of course, be embodied in many other forms and configurations without departing from the spirit of the invention as set forth in the appended claim.

I claim:

A heat dissipating mounting for a junction type semiconductor comprising a first wall having sides extending laterally thereto, a second wall attached to said sides to form a liquid and vapor sealed chamber, said second wall having a flange extending inwardly into said chamber, a semiconductor fitting in said flange and having a wafer supporting wall in said chamber and between said walls, reinforcing means extending between said walls, a coolant partially filling said chamber to form a vapor space thereabout and immersing said semiconductor with said wafer supporting wall in contact with said coolant, said coolant having a low vapor pressure in the desired operating range of the semiconductor and good wetting qualities to form small vapor bubbles on said wafer supporting wall and said flange to extract heat therefrom and rapidly detaching to disperse in said vapor space for condensation on said walls to maintain the operating temperature of the wafer supporting wall a few degrees above the temperature of the chamber forming walls.

References Cited by the Examiner

UNITED STATES PATENTS

| | | | |
|---|---|---|---|
| 2,886,746 | 5/1959 | Saby | 317—234 |
| 2,979,644 | 4/1961 | Salzer | 217—234 |
| 3,033,440 | 5/1962 | Ruppright | 230—45 |
| 3,033,537 | 5/1962 | Brown | 257—263 |
| 3,167,689 | 1/1965 | Mueller | 317—100 |

FOREIGN PATENTS

| | | |
|---|---|---|
| 804,297 | 11/1958 | Great Britain. |

ROBERT K. SCHAEFER, *Primary Examiner.*

KATHLEEN H. CLAFFY, *Examiner.*

H. J. RICHMAN, *Assistant Examiner.*